(12) United States Patent
Kumar

(10) Patent No.: US 9,219,067 B2
(45) Date of Patent: Dec. 22, 2015

(54) CONFIGURATION BIT ARCHITECTURE FOR PROGRAMMABLE INTEGRATED CIRCUIT DEVICE

(71) Applicant: Altera Corporation, San Jose, CA (US)

(72) Inventor: Rajiv Kumar, Pulau Pinang (MY)

(73) Assignee: Altera Corporation, San Jose, CA (US)

( * ) Notice: Subject to any disclaimer, the term of this patent is extended or adjusted under 35 U.S.C. 154(b) by 104 days.

(21) Appl. No.: 14/162,923

(22) Filed: Jan. 24, 2014

(65) Prior Publication Data

US 2015/0214229 A1 Jul. 30, 2015

(51) Int. Cl.
  *G11C 7/12* (2006.01)
  *G11C 11/41* (2006.01)
  *H01L 27/105* (2006.01)
  *G11C 11/412* (2006.01)

(52) U.S. Cl.
  CPC .............. *H01L 27/1052* (2013.01); *G11C 7/12* (2013.01); *G11C 11/41* (2013.01); *G11C 11/412* (2013.01); *G11C 11/4125* (2013.01); *H01L 2924/1437* (2013.01)

(58) Field of Classification Search
  CPC ................... H01L 27/1052; H01L 2924/1437; G11C 11/41; G11C 11/4125; G11C 7/12
  USPC ................. 365/189.08, 72, 154, 189.11, 206, 365/185.05
  See application file for complete search history.

(56) References Cited

U.S. PATENT DOCUMENTS

| | | | |
|---|---|---|---|
| 5,966,324 A * | 10/1999 | Wada et al. | 365/177 |
| 7,672,152 B1 | 3/2010 | Kulkarni et al. | |
| 8,482,963 B1 * | 7/2013 | Liu et al. | 365/154 |
| 2003/0107913 A1 | 6/2003 | Nii | |
| 2009/0175070 A1 * | 7/2009 | Houston | 365/154 |
| 2013/0154027 A1 * | 6/2013 | Liaw | 257/390 |
| 2014/0169074 A1 * | 6/2014 | Sinha et al. | 365/154 |
| 2015/0043270 A1 * | 2/2015 | Singh et al. | 365/154 |

* cited by examiner

*Primary Examiner* — Vanthu Nguyen
*Assistant Examiner* — Jerome Leboeuf
(74) *Attorney, Agent, or Firm* — Ropes & Gray LLP; Jeffrey H. Ingerman

(57) ABSTRACT

An array of memory cells on an integrated circuit device includes a plurality of memory cells arranged in at least one column. Each of the memory cells includes a plurality of transistors forming two complementary memory nodes. Each of the complementary memory nodes is connected to a respective pair of pull-up or pull-down transistors, which are connected in series and have a shared node between them. For a particular one of the memory cells, one of the shared nodes associated with one of the complementary memory nodes is directly connected to a corresponding respective shared node associated with a corresponding complementary memory node in a second one of the memory cells, and another of the shared nodes associated with another of the complementary memory nodes is directly connected to a corresponding shared node associated with a corresponding complementary memory node in a third one of the memory cells.

20 Claims, 8 Drawing Sheets

CONFIGURATION BIT ARCHITECTURE FOR PROGRAMMABLE INTEGRATED CIRCUIT DEVICE

FIELD OF THE INVENTION

This invention relates to a configuration bit architecture for a programmable integrated circuit device (e.g., a field-programmable gate array or FPGA), and particularly to such an architecture having reduced leakage.

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the configuration elements when the device is powered up. These devices generally provide the user with the ability to configure the devices for look-up-table-type logic operations.

One characteristic of the configuration elements is leakage, which increases power consumption by the programmable device. Leakage can be reduced by using stacked pull-up or pull-down transistors in the configuration memory. However, as device feature sizes decrease, it becomes increasingly difficult to implement stacked transistors without a large device area penalty, because of difficulty in isolating the nodes between the stacked transistors.

SUMMARY OF THE INVENTION

The inability to isolate the shared node between two pull-up or pull-down transistors is turned to advantage by intentionally interconnecting the shared nodes of adjacent configuration memory cells in an alternating pattern which is described in more detail below. Depending on the particular configuration bit stored in each cell, the interconnected nodes will either leak or not leak. Where the nodes do not leak, the situation is improved over an architecture that does not include interconnected nodes. Where the nodes do leak, the situation is no worse than an architecture that does not include interconnected nodes. As will be seen below, because most programmable device configuration bitstreams contain mostly zeroes, shared nodes that do not leak will normally predominate, and leakage is reduced in most cases.

In accordance with the present invention there is provided an array of memory cells on an integrated circuit device, including a plurality of memory cells arranged in at least one column. Each of the memory cells includes a plurality of transistors forming two complementary memory nodes, with one of the complementary memory nodes storing a value and another of the complementary memory nodes storing a complement of the value. Each respective one of the complementary memory nodes is connected to a respective pair of pull-up or pull-down transistors. The respective pair of pull-up or pull-down transistors is connected in series and has a respective shared node between them. For a particular one of the memory cells, one of the respective shared nodes associated with one of the complementary memory nodes is directly connected to a corresponding respective shared node associated with a corresponding complementary memory node in a second one of the memory cells, and another of the respective shared nodes associated with another of the complementary memory nodes is directly connected to a corresponding respective shared node associated with a corresponding complementary memory node in a third one of the memory cells.

A programmable integrated circuit device incorporating such a memory array, and a method of forming such a memory array, are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

As is well known, an FPGA or similar programmable device may include logic elements, each of which contains a look-up table that can be programmed or configured to provide a desired set of outputs for each potential set of inputs by loading the look-up table with a particular set of bit values. Similarly, the logic elements may be interconnected by configurable interconnection conductors that allow inputs and outputs of the logic elements to be routed as desired. In such devices, broadly speaking, the loading of the look-up tables, as well as the configuration of the interconnection conductors, is accomplished by a set of configuration bits (sometimes referred to as the "configuration bitstream") which, in the case of the look-up tables, represent the values in the look-up tables, and in the case of the interconnection conductors, selectively close switches (e.g., transistors) that connect one conductor to another to implement the desired routing.

The configuration bits may be stored on the programmable device in memory cells provided for that purpose. Although the configuration memory cells may be located near the logic or interconnect components that they program, the configuration memory cells tend to be clustered near each other in one or more arrays on the programmable device.

Figure 1:
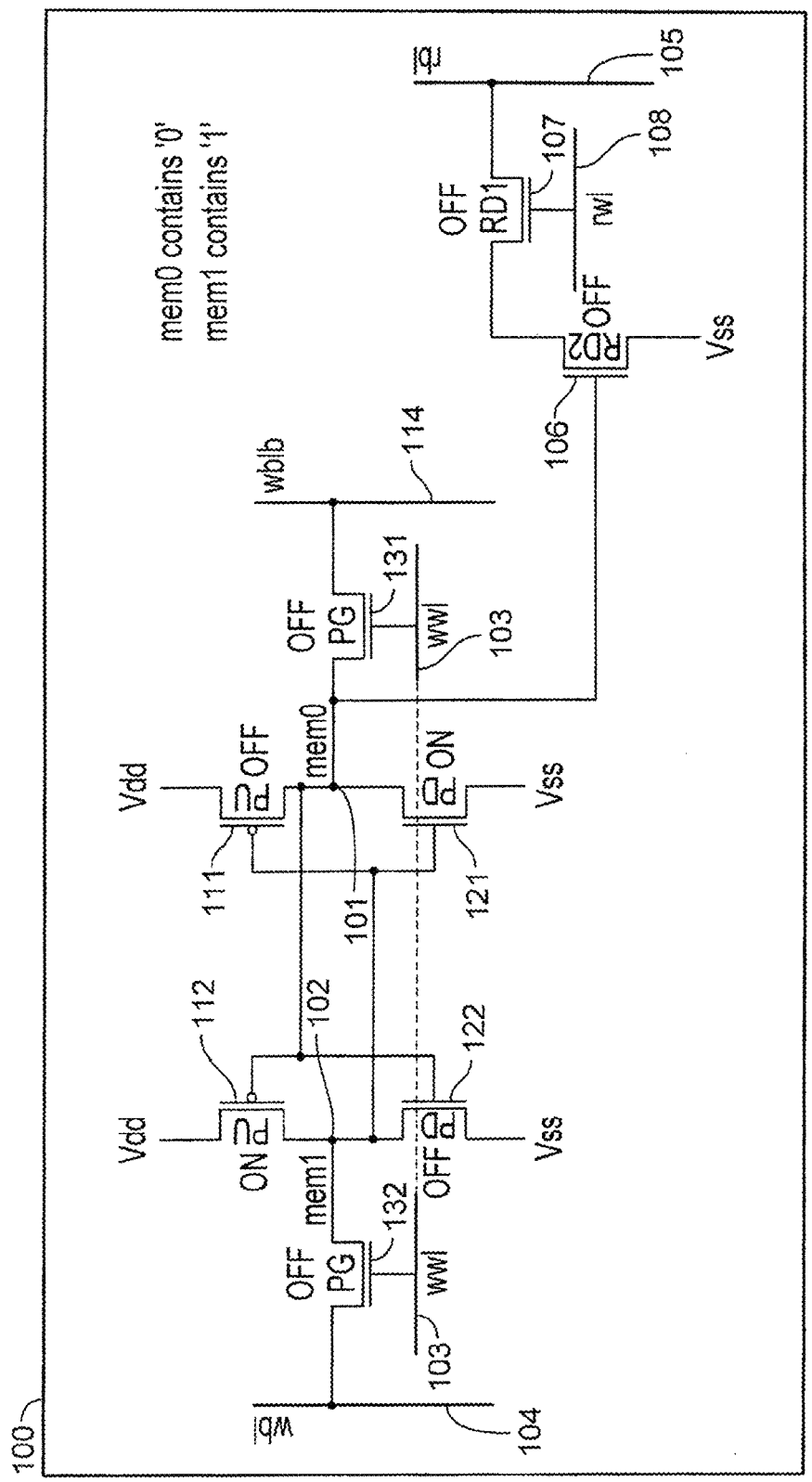
FIG. 1 shows a known memory cell configuration.

A typical configuration for a known configuration memory cell 100 is shown in FIG. 1. In memory cell 100, a bit is stored on two complementary nodes mem0 101 and mem1 102, between respective pull-up and pull-down transistors 111, 121 and 112, 122. Writing is accomplished using write transistors 131, 132 by applying signals to write word line wwl 103, write bit line wbl 104, and inverse write bit line wblb 114. Reading is accomplished at read bit line rbl 105 using read transistor 106, and read transistor 107 gated by read word line rwl 108. Although memory cell 100 uses eight transistors, other configurations, such as a six-transistor memory cell (not shown), are possible.

Figure 2:
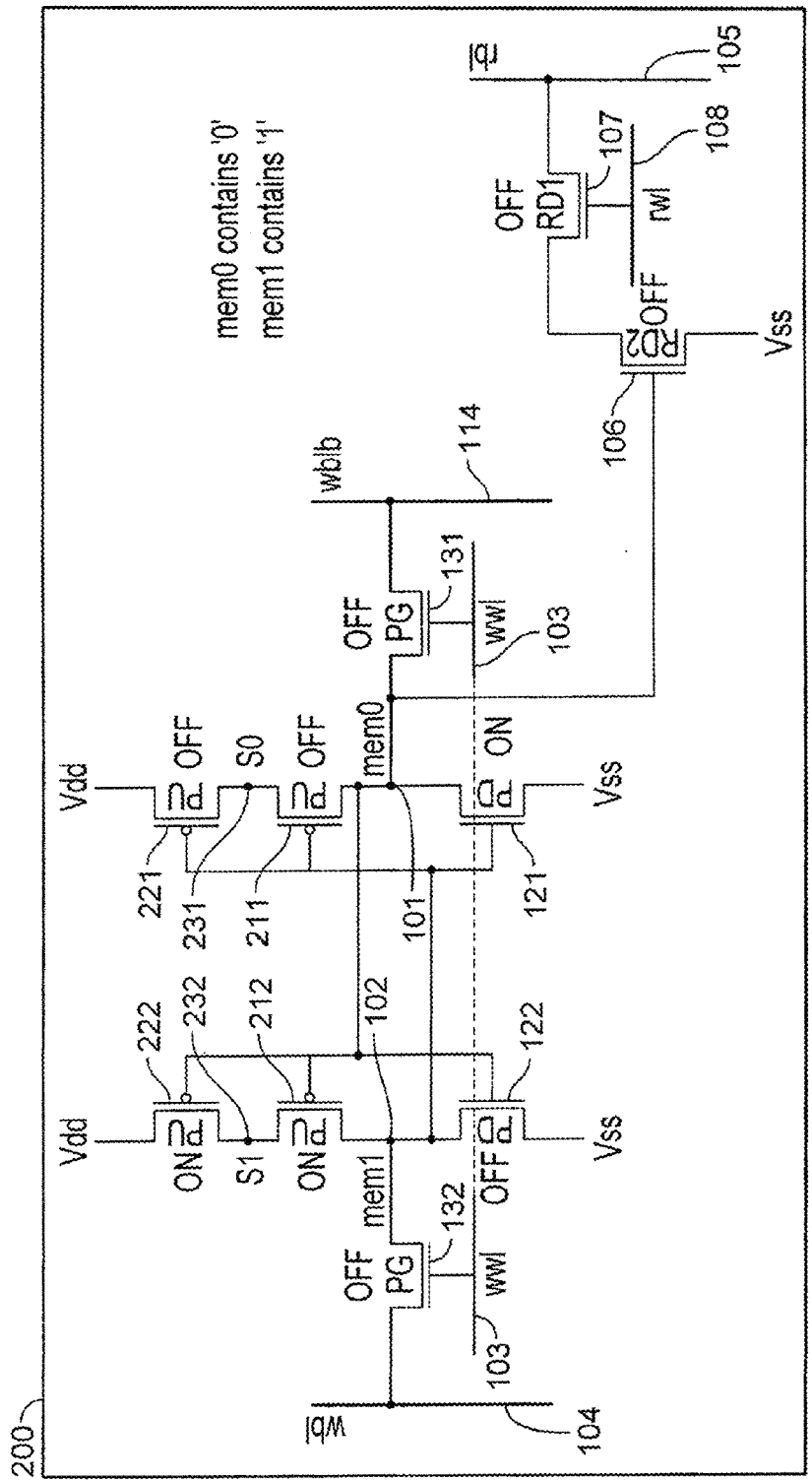
FIG. 2 shows a known memory cell configuration with stacked pull-up transistors.

In order to reduce leakage in memory cell 100, a known alternate architecture may be used in memory cell 200 (FIG. 2), where pull-up transistors 111, 112 may be replaced by stacked pull-up transistors 211, 221 and 212, 222.

The ability of the stacked pull-up (or pull-down) transistors to reduce leakage in memory cell 200 is dependent at least in part on the ability to isolate nodes 231 and 232. However, as device feature sizes become smaller, it becomes more difficult to achieve such isolation without a large area penalty. For example, in non-planar multigate field-effect transistors, commonly referred to as finFETs, the area penalty to isolate these nodes may be nearly 100% (i.e., the cell size would nearly double).

Embodiments of the present invention allow for stacking of pull-up or pull-down transistors with little area penalty, taking advantage of the difficulty in isolating the nodes between the stacked transistors (hereinafter referred to as the "stacked pull-up node" or "stacked pull-down node") by intentionally connecting those nodes in pairs of adjacent transistors. The nodes are connecting in an alternating pattern in which the stacked pull-up or pull-down node associated with one of the two complementary memory nodes in a particular cell is connected the stacked pull-up or pull-down node associated with a corresponding complementary memory node in a neighboring cell on one side of (i.e., "above" or "below") the particular cell, while the other of the two complementary memory nodes in the particular cell is connected to the stacked pull-up or pull-down node associated with the corresponding other complementary memory node in a neighboring cell on the other side of (i.e., "below" or "above") the particular cell. In other words, each of the two stacked pull-up or pull-down nodes in a particular cell is connected a corresponding stacked pull-up or pull-down node in a neighboring cell, but the two stacked pull-up or pull-down nodes are connected to stacked pull-up or pull-down nodes in different neighboring cells. Specifically, if the stacked pull-up or pull-down node associated with one of the complementary memory nodes in a "current" cell is connected to the stacked pull-up or pull-down node associated with a corresponding one of the complementary memory nodes in the cell "above" the current cell, then the stacked pull-up or pull-down node associated with the other one of the complementary memory nodes in a "current" cell is connected to the stacked pull-up or pull-down node associated with the corresponding other one of the complementary memory nodes in the cell "below" the current cell.

This arrangement of interconnections is referred to in this description, and in the claims that follow, as an "alternating complementary pattern." In particular, the term "alternating complementary pattern," or variants thereof, used in the claims that follow should be interpreted only by reference to this description, and not by reference to any dictionary or other extrinsic source.

Figure 3:
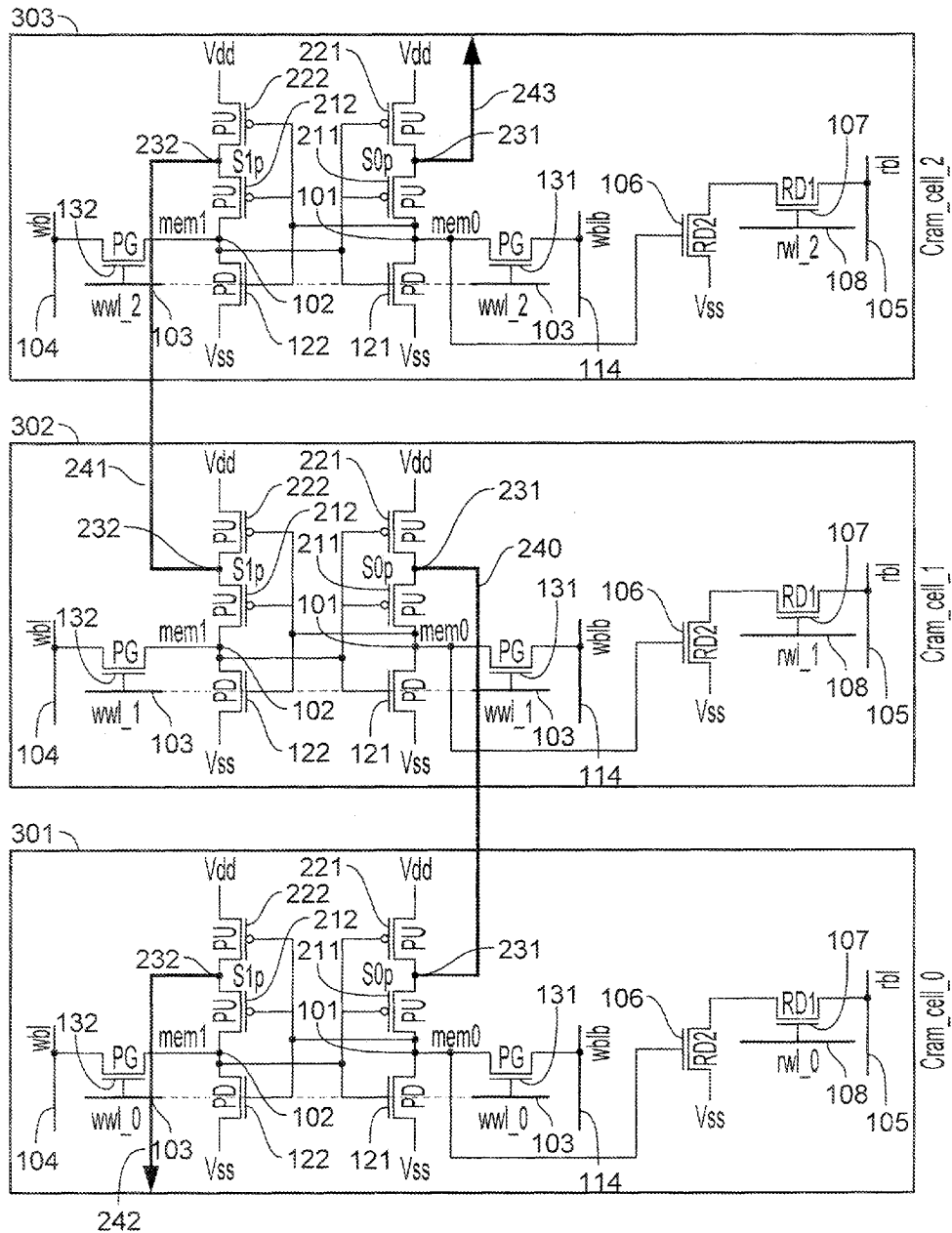
FIG. 3 shows an arrangement of memory cells according to an embodiment of the present invention with stacked pull-up transistors.

FIG. 3 shows such an arrangement involving three memory cells 301, 302, 303, each of which is similar to memory cell 200. The center cell 302 in this arrangement corresponds to the "current" cell referred to above, while upper cell 303 corresponds to the cell "above" the current cell, and lower cell 301 corresponds to the cell "below" the current cell. As can be seen, stacked pull-up node 231 associated with mem0 node 101 of center cell 302 is connected by connection 240 to stacked pull-up node 231 associated with mem0 node 101 of lower cell 301, while stacked pull-up node 232 associated with mem1 node 102 of center cell 302 is connected by connection 241 to stacked pull-up node 232 associated with mem1 node 102 of upper cell 303.

As can also be seen, the pattern continues to further adjacent cells, with stacked pull-up node 232 associated with mem1 node 102 of lower cell 301 having a connection 242 extending to the unseen stacked pull-up node 232 associated with mem1 node 102 of another cell below lower cell 301, and similarly, with stacked pull-up node 231 associated with mem0 node 101 of upper cell 303 having a connection 243 extending to the unseen stacked pull-up node 231 associated with mem0 node 101 of another cell above upper cell 303. This alternating complementary pattern continues until the last upper and lower rows of the array of configuration memory cells, where unpaired nodes either may be left unshared, or may be connected to other non-contention logic or the existing end cells that are used to protect memory arrays at the edges.

Figure 4:
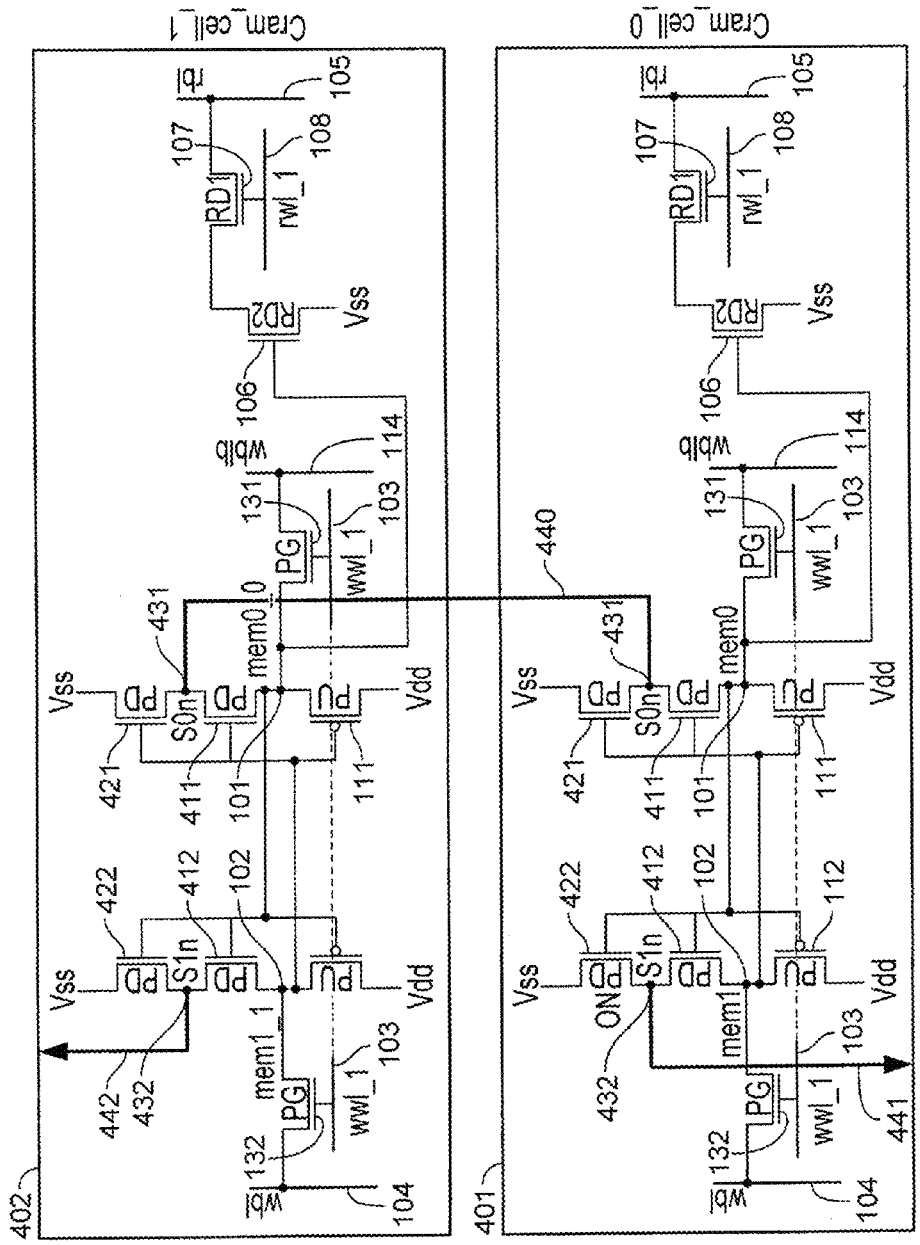
FIG. 4 shows an arrangement of memory cells according to an embodiment of the present invention with stacked pull-down transistors.

FIG. 4 shows an arrangement similar to FIG. 3, but showing only two cells rather than three cells, and illustrating the case where stacked pull-down transistors are used instead of stacked pull-up transistors. Cells 401, 402 are, again, similar to cell 100, but with pull-down transistors 121, 122 be replaced by stacked pull-down transistors 411, 421 and 412, 422. As can be seen, stacked pull-down node 431 associated with mem0 node 101 of cell 401 is connected by connection 440 to stacked pull-down node 431 associated with mem0 node 101 of cell 402. As can also be seen, stacked pull-down node 432 associated with mem1 node 102 of cell 401 has a connection 441 extending to the unseen stacked pull-down node 432 associated with another unseen cell below cell 401, while stacked pull-down node 432 associated with mem1 node 102 of cell 402 has a connection 442 extending to the unseen stacked pull-down node 432 associated with another unseen cell above cell 402.

Figure 5:
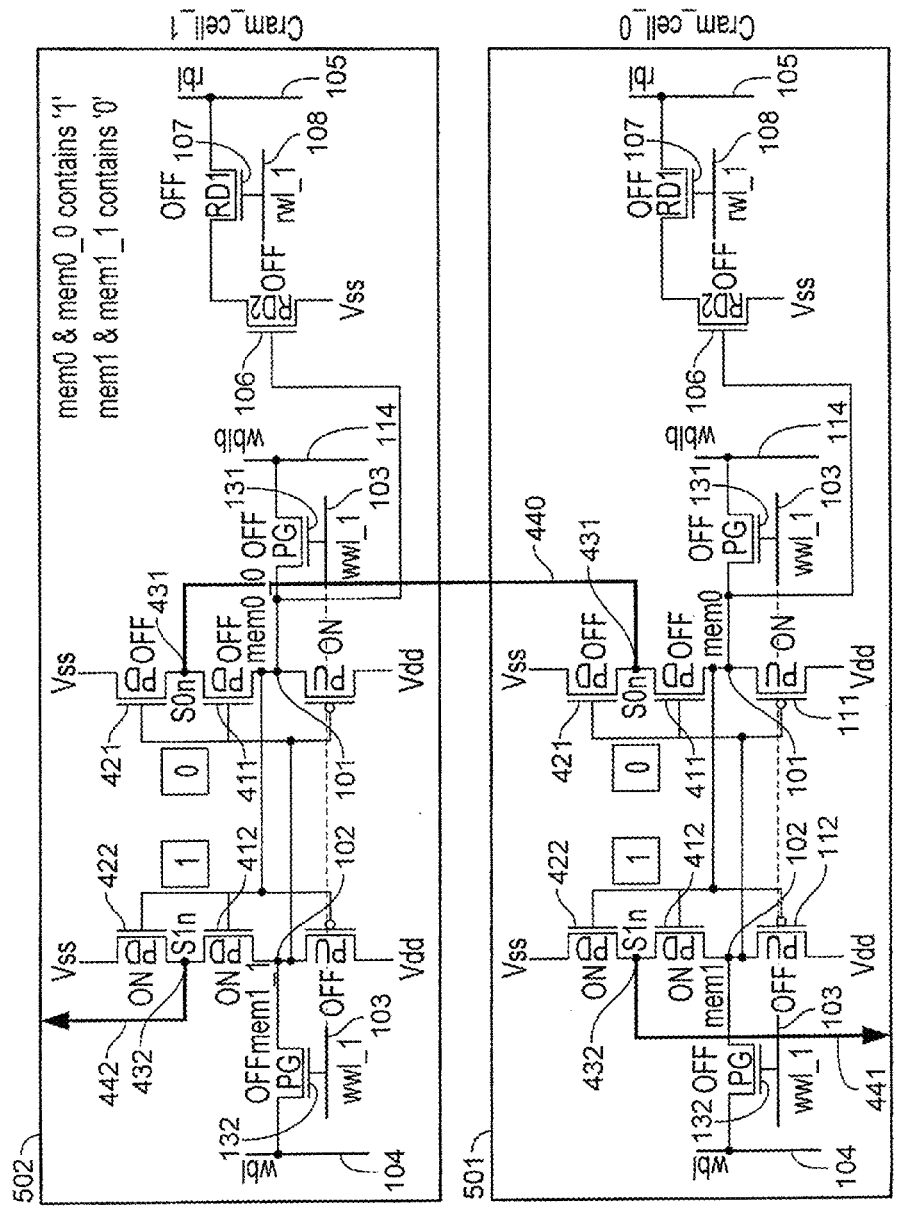
FIG. 5 shows the effect of leakage on the arrangement of FIG. 4 for a first set of data values.
Figure 6:
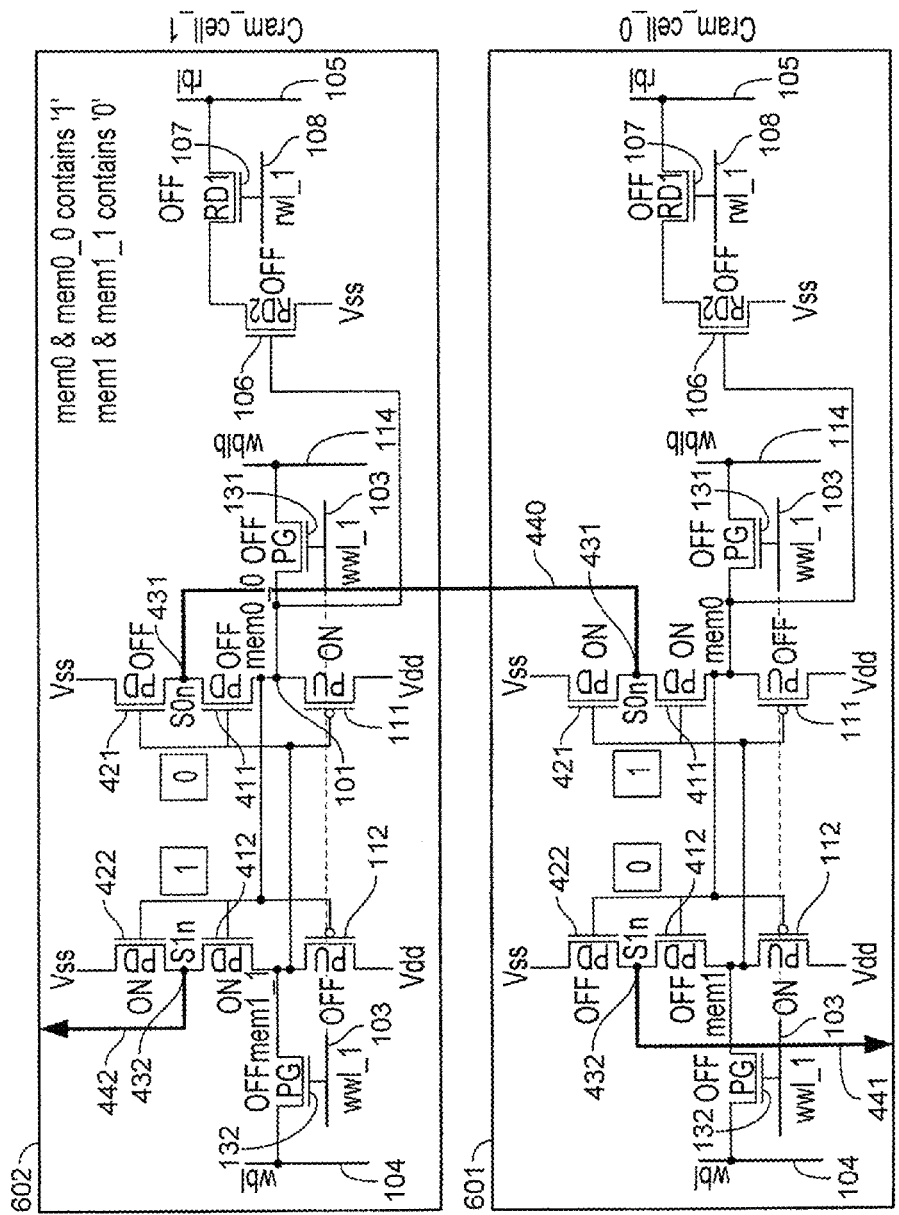
FIG. 6 shows the effect of leakage on the arrangement of FIG. 4 for a second set of data values.

FIGS. 5 and 6 show the effect on leakage of the disclosed alternating complementary pattern, using the stacked pull-down case of FIG. 4 as an example.

In FIG. 5, both cells 501 and 502 store the same value, with a '1' on mem0 node 101 of each cell and a '0' on mem1 node 102 of each cell. Considering the stacked pull-down nodes 431 associated with the two mem0 nodes 101, which pull-down nodes 431 are connected by connection 440, all of the pull-down transistors 411, 421 are OFF, meaning each mem0 node 101 is two transistors away from Vss, meaning that leakage is prevented or reduced. The same would be true in the pull-up case with a '1' on each mem0 node 101.

On the other hand, in FIG. 6, where the two cells 601 and 602 store opposite values, with a '0' on mem1 node 102 of cell 602 and a '1' on mem1 node 102 of cell 601, the pull-down transistors 411, 421 associated with mem0 node 101 of cell 602 are OFF but the pull-down transistors 411, 421 associated with mem0 node 101 of cell 601 are ON, meaning that both pull-down nodes 431 associated with the two mem0 nodes 101 are at Vss. Therefore, mem0 node 101 of cell 602 is only one transistor away from Vss, and is leaking.

As noted above, in planar transistor technologies, when implementing stacked pull-up or pull-down transistors, the nodes between the stacked transistors could easily be isolated, and therefore leakage could be reduced. But in nonplanar technologies, such as non-planar multigate field-effect transistors, leakage could not be reduced without substantial area penalty because of the difficulty in isolating the nodes between the stacked transistors. As described in connection with FIGS. 5 and 6, however, leakage can be reduced, using the disclosed alternating complementary pattern of shared nodes, when adjacent cells store the same value, although not when adjacent cells store opposite values. However, this is still an improvement over previously known arrangements where leakage could not be reduced at all, or only at great area penalty.

For a programmable device such as an FPGA using this arrangement, the actual leakage reduction will depend on the particular configuration bitstream for a given user logic design, which will determine how many cells store '0' and how many cells store '1', and what the pattern is (i.e., whether adjacent cells store identical or differing bits). Empirically, it has been observed that most FPGA configuration bitstreams are mostly zeroes—i.e., about 70% to about 80% zeroes.

It can be shown that for a configuration bitstream that is 80% zeroes, depending on the pattern of ones and zeroes in the bitstream, using the disclosed alternating complementary pattern of shared nodes will reduce leakage by between about 20% and about 26%. For a configuration bitstream that is 70% zeroes, it can be shown that, depending on the pattern of ones and zeroes in the bitstream, using the disclosed alternating complementary pattern of shared nodes will reduce leakage by between about 13% and about 26%. For a configuration bitstream that is 60% zeroes, it can be shown that, depending on the pattern of ones and zeroes in the bitstream, using the disclosed alternating complementary pattern of shared nodes will reduce leakage by between about 6% and about 26%. For a configuration bitstream that is 50% zeroes, it can be shown that, depending on the pattern of ones and zeroes in the bitstream, using the disclosed alternating complementary pattern of shared nodes will reduce leakage by between about 3% and about 26%. Thus, for a configuration bitstream having as few as about 50% zeroes, there is at least some improvement, and as much as about 26% improvement, or perhaps even up to about 30% improvement, when implementing configuration RAM cells with stacked pull-up or pull-down, even in a non-planar multigate field-effect transistor environment, using the disclosed alternating complementary pattern of shared nodes of the stacked pull-up or pull-down transistors.

Figure 7:
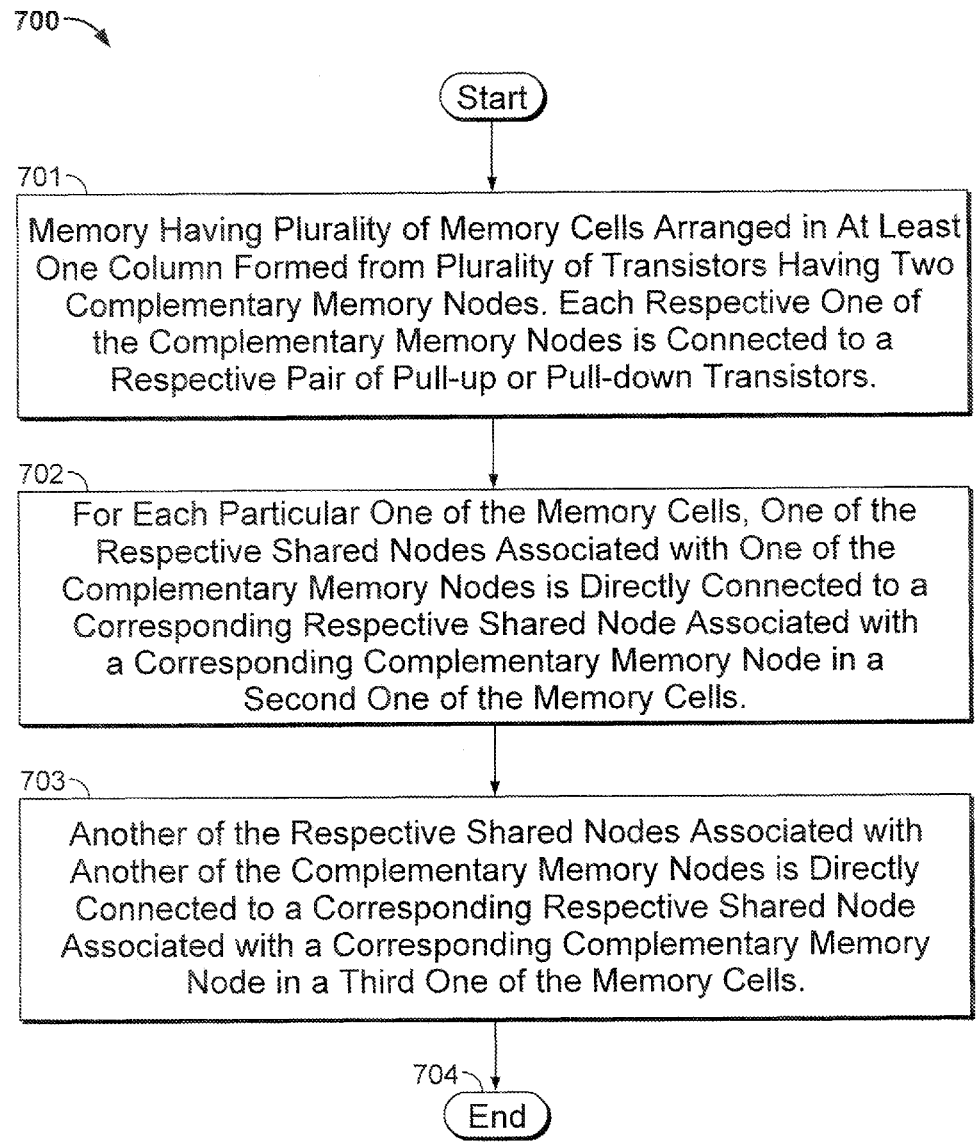
FIG. 7 is a flow diagram of a method according to an embodiment of the invention for forming a memory structure.

FIG. 7 is a flow diagram of one possible embodiment 700 of a method according to the present invention for forming a memory structure on an integrated circuit device. At 701, a memory having a plurality of memory cells arranged in at least one column is formed from a plurality of transistors having two complementary memory nodes, with each respective one of the complementary memory nodes being connected to a respective pair of pull-up or pull-down transistors.

At 702, for each particular one of the memory cells, one of the respective shared nodes associated with one of the complementary memory nodes is directly connected to a corresponding respective shared node associated with a corresponding complementary memory node in a second one of the memory cells. The second one of the memory cells may be above, and may be adjacent to, the particular one of the memory cells.

At 703, another of the respective shared nodes associated with another of the complementary memory nodes is directly connected to a corresponding respective shared node associated with a corresponding complementary memory node in a third one of the memory cells. The third one of the memory cells may be below, and may be adjacent to, the particular one of the memory cells.

When the method ends at 704, the result is a memory array in which the memory cells in the array are connected by an alternating complementary pattern of shared nodes of the stacked pull-up or pull-down transistors.

Thus it is seen that a memory structure having reduced leakage, and a method for forming that structure, are provided. Although the structure and method have been described in the context of a configuration memory for a programmable integrated circuit device, and in terms of non-planar multigate field-effect transistors, the invention is applicable to any type of memory device using any transistor construction.

Figure 8:
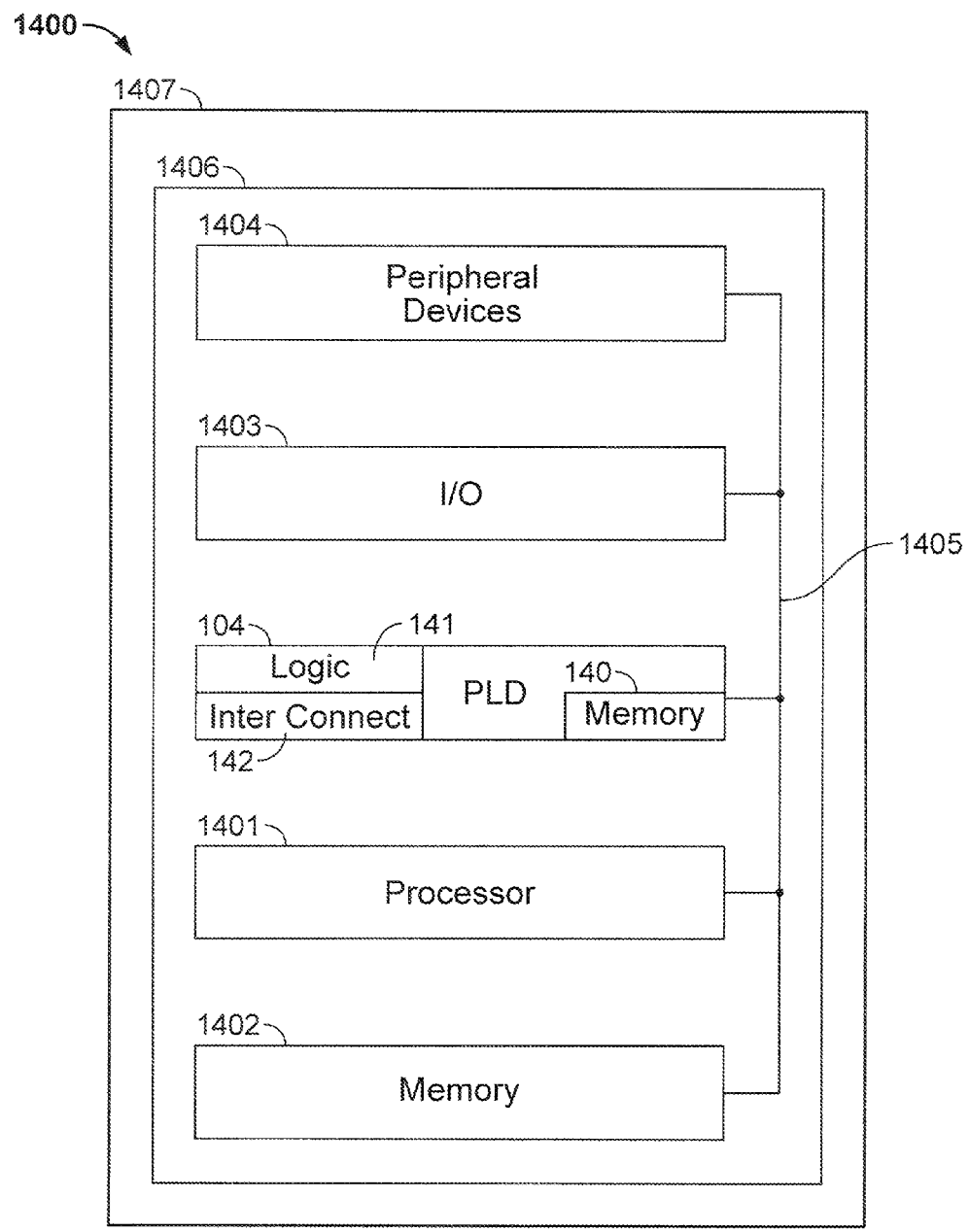
FIG. 8 is a simplified block diagram of an illustrative system employing a programmable logic device incorporating the present invention.

A programmable logic device (PLD) 104 incorporating configuration memory 140 according to embodiments of the present invention, along with programmable logic 141 and configurable interconnect 142, may be used in many kinds of electronic devices. One possible use is in a data processing system 1400 shown in FIG. 8. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

System 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 104 can be configured as a processor or controller that works in cooperation with processor 1401. PLD 104 may also be used as an arbiter for arbitrating access to a shared resources in system 1400. In yet another example, PLD 104 can be configured as an interface between processor 1401 and one of the other components in system 1400. It should be noted that system 1400 is only exemplary, and that the true scope and spirit of the invention should be indicated by the following claims.

Various technologies can be used to implement PLDs 104 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. An array of memory cells on an integrated circuit device, comprising:
   a plurality of memory cells arranged in at least one column, wherein:
   each of said memory cells comprises a plurality of transistors forming two complementary memory nodes, one of said complementary memory nodes storing a value and another of said complementary memory nodes storing a complement of said value;
   each respective one of said complementary memory nodes is connected to a respective pair of pull-up or pull-down transistors, said respective pair of pull-up or pull-down transistors being connected in series and having a respective shared node therebetween;

for a particular one of said memory cells, one of said respective shared nodes associated with one of said complementary memory nodes is directly connected to a corresponding respective shared node associated with a corresponding complementary memory node in a second one of said memory cells, and another of said respective shared nodes associated with another of said complementary memory nodes is directly connected to a corresponding respective shared node associated with a corresponding complementary memory node in a third one of said memory cells.

2. The array of memory cells of claim 1 wherein:
said second one of said memory cells is above said particular one of said memory cells; and
said third one of said memory cells is below said particular one of said memory cells.

3. The array of memory cells of claim 2 wherein said second one of said memory cells and said third one of said memory cells are adjacent said particular one of said memory cells; whereby:
complementary memory nodes of said memory cells in said column are connected in an alternating complementary pattern.

4. The array of memory cells of claim 1 wherein each of said transistors is a non-planar multigate field-effect transistor.

5. The array of memory cells of claim 1 wherein:
said respective pair of pull-up or pull-down transistors is a pair of PMOS pull-up transistors; and
each of said complementary memory nodes is formed between a single NMOS pull-down transistor and said pair of PMOS pull-up transistors.

6. The array of memory cells of claim 5 wherein each of said transistors is a non-planar multigate field-effect transistor.

7. The array of memory cells of claim 1 wherein:
said respective pair of pull-up or pull-down transistors is a pair of NMOS pull-down transistors; and
each of said complementary memory nodes is formed between a single PMOS pull-up transistor and said pair of NMOS pull-down transistors.

8. The array of memory cells of claim 7 wherein each of said transistors is a non-planar multigate field-effect transistor.

9. The array of memory cells of claim 1 wherein:
said integrated circuit device is a programmable integrated circuit device; and
said array of memory cells forms configuration memory of said programmable integrated circuit device.

10. A programmable integrated circuit device comprising:
areas of programmable logic;
configurable interconnect resources; and
configuration memory storing configuration bits that program said areas of programmable logic and that configure said configurable interconnect resources, said configuration memory comprising a plurality of memory cells arranged in at least one column, wherein:
each of said memory cells comprises a plurality of transistors forming two complementary memory nodes, one of said complementary memory nodes storing a value and another of said complementary memory nodes storing a complement of said value;
each respective one of said complementary memory nodes is connected to a respective pair of pull-up or pull-down transistors, said respective pair of pull-up or pull-down transistors being connected in series and having a respective shared node therebetween;

for a particular one of said memory cells, one of said respective shared nodes associated with one of said complementary memory nodes is directly connected to a corresponding respective shared node associated with a corresponding complementary memory node in a second one of said memory cells, and another of said respective shared nodes associated with another of said complementary memory nodes is directly connected to a corresponding respective shared node associated with a corresponding complementary memory node in a third one of said memory cells.

11. The programmable integrated circuit device of claim 10 wherein:
said second one of said memory cells is above said particular one of said memory cells; and
said third one of said memory cells is below said particular one of said memory cells.

12. The programmable integrated circuit device of claim 11 wherein said second one of said memory cells and said third one of said memory cells are adjacent said particular one of said memory cells; whereby:
complementary memory nodes of said memory cells in said column are connected in an alternating complementary pattern.

13. The programmable integrated circuit device of claim 10 wherein each of said transistors is a non-planar multigate field-effect transistor.

14. The programmable integrated circuit device of claim 10 wherein:
said respective pair of pull-up or pull-down transistors is a pair of PMOS pull-up transistors; and
each of said complementary memory nodes is formed between a single NMOS pull-down transistor and said pair of PMOS pull-up transistors.

15. The programmable integrated circuit device of claim 14 wherein each of said transistors is a non-planar multigate field-effect transistor.

16. The programmable integrated circuit device of claim 10 wherein:
said respective pair of pull-up or pull-down transistors is a pair of NMOS pull-down transistors; and
each of said complementary memory nodes is formed between a single PMOS pull-up transistor and said pair of NMOS pull-down transistors.

17. The programmable integrated circuit device of claim 16 wherein each of said transistors is a non-planar multigate field-effect transistor.

18. A method of forming a memory array on an integrated circuit device, said memory having a plurality of memory cells arranged in at least one column, each of said memory cells including a plurality of transistors forming two complementary memory nodes, and each respective one of said complementary memory nodes being connected to a respective pair of pull-up or pull-down transistors, said respective pair of pull-up or pull-down transistors being connected in series and having a respective shared node therebetween, said method comprising:
for each particular one of said memory cells, directly connecting one of said respective shared nodes associated with one of said complementary memory nodes to a corresponding respective shared node associated with a corresponding complementary memory node in a second one of said memory cells, and directly connecting another of said respective shared nodes associated with another of said complementary memory nodes to a corresponding respective shared node associated with a corresponding complementary memory node in a third one of said memory cells.

19. The method of claim 18 wherein:

said second one of said memory cells is above said particular one of said memory cells; and said third one of said memory cells is below said particular one of said memory cells.

20. The method of claim 19 wherein:

said second one of said memory cells and said third one of said memory cells are adjacent said particular one of said memory cells; and complementary memory nodes of said memory cells in said column are connected in an alternating complementary pattern.

* * * * *